United States Patent
Xie et al.

(10) Patent No.: US 11,094,803 B1
(45) Date of Patent: Aug. 17, 2021

(54) NANOSHEET DEVICE WITH TALL SUSPENSION AND TIGHT CONTACTED GATE POLY-PITCH

(71) Applicant: International Business Machines Corporation, Armonk, NY (US)

(72) Inventors: Ruilong Xie, Niskayuna, NY (US); Julien Frougier, Albany, NY (US); Ardasheir Rahman, Schenectady, NY (US); Veeraraghavan S. Basker, Schenectady, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/776,069

(22) Filed: Jan. 29, 2020

(51) Int. Cl.
| | |
|---|---|
| H01L 29/66 | (2006.01) |
| H01L 29/78 | (2006.01) |
| H01L 29/06 | (2006.01) |
| H01L 21/308 | (2006.01) |
| H01L 29/423 | (2006.01) |
| H01L 27/12 | (2006.01) |

(52) U.S. Cl.
CPC ...... *H01L 29/6681* (2013.01); *H01L 27/1211* (2013.01); *H01L 29/0653* (2013.01); *H01L 29/0673* (2013.01); *H01L 29/42392* (2013.01); *H01L 29/6653* (2013.01); *H01L 29/6656* (2013.01); *H01L 29/66545* (2013.01); *H01L 29/66553* (2013.01); *H01L 29/7853* (2013.01)

(58) Field of Classification Search
CPC ............. H01L 27/1211; H01L 29/0653; H01L 29/0673; H01L 29/42392; H01L 29/66439; H01L 29/66545; H01L 29/6653; H01L 29/66553; H01L 29/6656; H01L 29/6681; H01L 29/775; H01L 29/7853

See application file for complete search history.

(56) References Cited

U.S. PATENT DOCUMENTS

| | | | |
|---|---|---|---|
| 9,923,055 B1 | 3/2018 | Cheng et al. | |
| 9,991,352 B1 | 6/2018 | Frougier et al. | |
| 10,014,390 B1 * | 7/2018 | Bouche | H01L 29/42376 |
| 10,217,817 B2 | 2/2019 | Chang et al. | |

(Continued)

OTHER PUBLICATIONS

N. Loubet et al., "Stacked nanosheet gate-all-around transistor to enable scaling beyond FinFET," Symposium on VLSI Technology, 2017, pp. T230-T231.

*Primary Examiner* — David C Spalla
(74) *Attorney, Agent, or Firm* — Jeffrey S. LaBaw; Lou Percello, Attorney, PLLC

(57) ABSTRACT

A nanosheet FET has a substrate, an insulating layer disposed on the substrate, a source disposed on the insulating layer, and a drain disposed on the insulting layer. A plurality of parallel channels electrically and physically connects to and between the source and drain. One or more of the channels is separated from one or more adjacent and parallel channels by a suspension distance with two inner spacers. The inner spacers have three parts: a lower inner spacer, a middle inner spacer, and an upper inner spacer. The inner spacer design enables making the inner spacer using thinner layers of deposited dielectric material. The thinner deposition layers do not close the device spacing as much and enable smaller CPP while maintaining taller suspension distances.

20 Claims, 13 Drawing Sheets

(56) References Cited

U.S. PATENT DOCUMENTS

| | | |
|---|---|---|
| 10,269,983 B2 | 4/2019 | Frougier et al. |
| 10,388,755 B1 | 8/2019 | Lee et al. |
| 10,446,664 B1 | 10/2019 | Cheng et al. |
| 10,903,317 B1 * | 1/2021 | Frougier ............... H01L 29/775 |
| 2019/0058052 A1 | 2/2019 | Frougier et al. |
| 2019/0214459 A1 | 7/2019 | Cheng et al. |

* cited by examiner

NANOSHEET DEVICE WITH TALL SUSPENSION AND TIGHT CONTACTED GATE POLY-PITCH

BACKGROUND

The present invention relates to nanosheet semiconductor devices and methods. More specifically, the invention relates to reducing the pitch of nanosheet semiconductor devices.

Fin-type Field Effect Transistors (FinFETs) are non-planar semiconductor device structures that can be more densely packed than planar FETs. FinFETs have a fin disposed on a substrate that defines a body region of semiconductor material. Doped source and drain regions, e.g. S/Ds, are formed in sections of the body region. A gate electrode wraps around an undoped or lightly doped channel located in the fin body region between the source and drain. When a voltage is applied to the gate electrode an electric field develops in the channel. The electric field causes changes in the channel that control a number of carriers (electrons or holes) flowing through the channel, i.e. current, from the source to the drain.

Nanosheet FETs are another type of device that have a high packing density caused by vertically stacking multiple nanosheet channel layers in a three-dimensional array. Sections of a gate stack may surround all sides of each of the individual nanosheet channel layers in a gate-all-around (GAA) arrangement. GAA devices provide a stronger gate control of the channel, particularly as the channel lengths shorten in scaled down device architectures.

Nanosheet FETs are usually arranged on substrates in an array. There is a device spacing between each of nanosheet devices. The dimension between a given component of a nanosheet device, e.g. an edge of a gate, to same component on an adjacent gate is called the pitch or the Contacted Gate Poly-Pitch (CPP).

To increase device density in the array, CPP must decrease. However, the device spacing also must decrease. Unfortunately, certain processes and structures during the nanosheet fabrication adversely affect and constrain the amount the device spacing can decrease.

For example, channels in nanosheet devices are separated by a distance called a suspension (or Tsus). The inner spacer thickness of the nanosheet device is similar to Tsus for a nanosheet device. The processes that form these channel inner spacers also form inner device liner spacers within the device spacing, i.e. around and between the gates of adjacent devices. These inner device liner spacers are typically at least b the thickness of the suspension or channel inner spacers, e.g. ½ Tsus. Since there is an inner device liner spacer thickness deposited on each adjacent gate, the spacing between the devices, or device spacing, is constrained approximately by the entire Tsus thickness amount. Further, the devices can be spaced no closer than the Tsus thickness, or the inner device layer spacers on the devices will interfere.

There is a need to reduce the device spacing, and therefore CPP, of nanosheet devices while maintaining a high or tall suspension between channels in nanosheet devices.

SUMMARY

One embodiment of the present invention is a nanosheet FET comprising a substrate, an optional insulating layer disposed on the substrate, a source disposed on the substrate/insulating layer, and a drain disposed on the substrate/insulting layer. A plurality of parallel channels electrically and physically connects to and are between the source and drain. Each of the channels has a source side connected to the source and a drain side connected the drain. One or more of the channels is separated from one or more adjacent and parallel channels by a suspension distance.

There are a plurality of inner spacers. Each inner spacer has an inner spacer thickness equal to the suspension distance and each of the inner spacers separates two adjacent channels either at the source side or the drain side of two adjacent channels.

The inner spacers have three parts: a lower inner spacer, a middle inner spacer, and an upper inner spacer.

A gate stack surrounds one or more of the channels.

The inner spacer design enables making the inner spacer using thinner layers of deposited dielectric material. The thinner deposition layers do not close the device spacing as much and enable smaller CPP while maintaining taller suspension distances. Methods of making the nanosheet FET device are disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
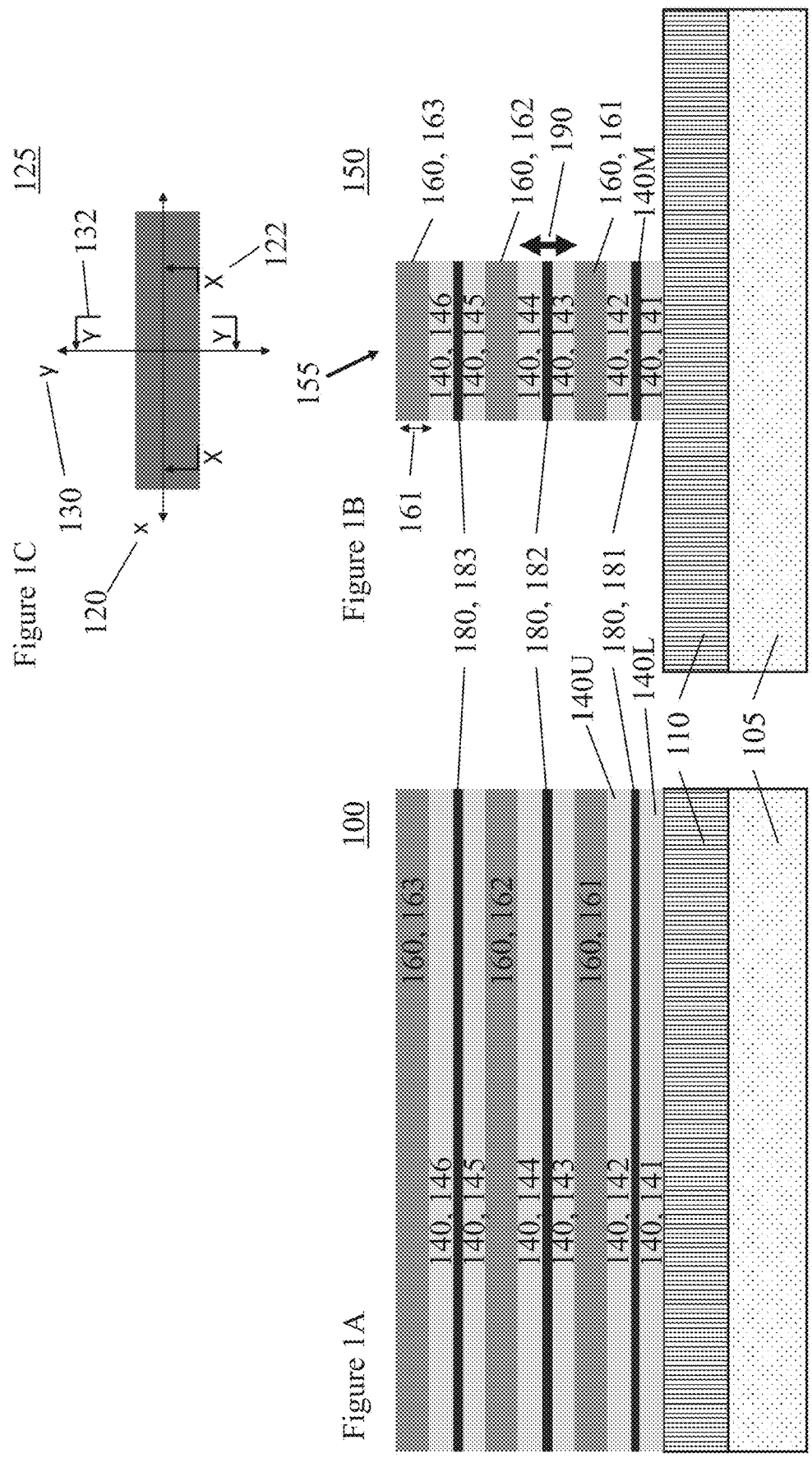
FIG. 1A is a cross section elevation of a formed nanosheet stack.
FIG. 1B is a cross section side elevation of the formed nanosheet stack in FIG. 1A.
FIG. 1C is a top view of the formed nanosheet stack in FIG. 1A showing directions and views.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located. Terms such as "thick", "thickness", "thin" or derivatives thereof may be used in place of "height" where indicated.

Conversely, a "depth" refers to a vertical (horizontal) size of an element (e.g., a layer, trench, hole, opening, indentation, etc.) in the cross-sectional or elevation views measured from a top (side) surface to a bottom (inside) surface of the element.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, indentation, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "disposed on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

The present invention decouples the suspension or distance between channels in a nanosheet FET device with the device spacing between nanosheet FET devices made from a nanosheet stack. The inner spacers between the channels in the nanosheet FET device are made from three separate layers—a top inner spacer layer, middle inner spacer layer, and bottom inner spacer layer. Since each of these inner spacer layers is thinner than the (entire) inner spacer, they can be created by a thinner conformal deposition around the entire structure. Being able to reduce the conformal deposition thickness, decreases the amount of space the conformal deposition occupies as an inner spacer liner between the devices. This enables the devices to be spaced closer together without interfering. Accordingly, the CPP, or pitch, of the devices can be reduced with less constraint on inner spacer thickness or suspension.

FIG. 1A is a cross section elevation of formed nanosheet stack 100. The nanosheet stack 100 has an electrically insulating layer 110 disposed on a substrate layer 105, which is optional, or can be formed later. A first layer made of a first sacrificial material like silicon-germanium 60 (SiGe60) (141, typically 140) is disposed on the insulating layer 110 or substrate 105. A layer of a second sacrificial material like silicon-germanium 20 (SiGe20) (181, typically 180) is disposed on the SiGe60 layer (141, 140). Another layer (142, 140) of the same first sacrificial material, e.g. SiGe60. is then disposed, followed by a layer of channel material like silicon, Si, (161, typically 160).

The pattern repeats. In some embodiments, next a layer SiGe60 (143, 140) is disposed, then a layer of SiGe20 (182, 180), another layer of SiGe60 (144, 140), followed by another layer of Si (162, 160). The pattern repeats again until all layers of the nanosheet stack 100 are deposited.

The Si layers 160 become the channels of the device. A nanosheet stack 100 can have layers supporting 1 to 10 channel (Si layers, 160) or more. The Si layers have a thickness 161 between 3 nanometers (nm) and 12 nm.

FIG. 1B is a cross section side elevation 150 of the example formed nanosheet stack 100 in FIG. 1A. A large, layered fin 155 is shown. In this embodiment, as in FIG. 1A, the final pattern of layers includes, a SiGe60 layer (145, 140), a SiGe20 layer (183, 180), another SiGe60 layer (146, 140), and the last Si layer (163, 160). Once the nanosheet stack is created, the fin 155 is made using known techniques, e.g. masking the fin and removing the material in the layers unprotected by the mask by a directional etch.

SiGe60 is 60 percent germanium (Ge) and 40 percent Si. SiGe20 is 20 percent Ge and 80 percent Si. In some embodiments, these materials are selected because they are chemically distinguishable from each other and the channel material, e.g. Si. Therefore, a layer can be chemically selected for partial or total removal without significantly affecting the other layers. Other materials are envisioned.

FIG. 1C is a top view 125 of the formed nanosheet stack in FIG. 1A showing directions x 120 and y 130 and views X-X 122 and Y-Y 132. View X-X 122 is looking at the x-axis 120 which goes through the cross-section elevation shown in FIG. 1A. View Y-Y 132 is looking at the y-axis 130 which goes through the cross-section elevation shown in FIG. 1B.

The substrate 105 can be made from a single element (e.g., silicon or germanium); primarily a single element (e.g., with doping); or a compound, for example, aluminum oxide ($Al_2O_3$), gallium arsenide (GaAs), silicon carbide (SiC), or silicon-germanium (SiGe). In some embodiments, the substrate 105 includes one or more semiconductor materials including, but not limited to, silicon (Si), SiGe, SiC, Si:C (carbon doped silicon), silicon germanium carbide (SiGeC), germanium (Ge), carbon doped silicon germanium (SiGe:C), Si alloys, Ge alloys, III-V materials (e.g., GaAs, aluminum gallium arsenide (AlGaAs), indium arsenide (InAs), indium phosphide (InP), aluminum arsenide (AlAs), etc.), II-V materials (e.g., cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), zinc cadmium selenide (ZnCdSe), etc., or any combination thereof) or other like semiconductors. In addition, multiple layers of the semiconductor materials can be used as the semiconductor material of the substrate 105. In some embodiments, the substrate 105 includes both semiconductor materials and dielectric materials. In some silicon on insulator (SOI) implementations, a buried oxide layer, BOX, (e.g., $SiO_2$) is buried in the substrate 105.

The insulating layer 110 electrically insulates the nanosheet layers (140, 160, and 180) from the substrate 105. This prevents current from leaking from the nanosheet layers (140, 160, and 180) to other devices on the insulation layer 110/substrate 105. The insulating layer 100, can be the box of a SOI substrate, or can be formed from known arts from a bulk substrate. The thickness of BOX layer 110 is typically in the range from about 20 nm to about 150 nm.

The SiGe60 layers 140, SiGe20 layers 180, and Si layers 160 are formed by well-known techniques, e.g. epitaxy. Examples of various epitaxial growth process apparatus that are suitable for use in one or more embodiments include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a combination thereof, and/or the like. Examples of silicon containing gas sources are silane, disilane, trisilane, tetrasilane, hexachlorodisilane, tetrachlorosilane, dichlorosilane, trichlorosilane, and combinations thereof. Examples of germanium containing gas sources are germane, digermane, halogermane, dichlorogermane, trichlorogermane, tetrachlorogermane and combinations thereof.

The thickness of the SiGe60 layers 140 is between 3 nm and 10 nm. The thickness of the SiGe20 180 layers is between 3 nm and 10 nm.

The combined thickness of two of the SiGe60 layers 140 and one of the SiGe20 layers 180 will determine the entire thickness of each of the inner spacer (850 below) between the channels of the device and is equal to the suspension, Tsus, 190. As is explained below in more detail, keeping the Tsus/suspension 190 tall enables a larger amount and a larger selection of gate working function metal around the channel surface and results in better device control.

In the patterns, the first sacrificial material 140 forms an upper layer 140U and a lower layer 140 with respect to a middle layer 140M formed by the second sacrificial material.

Figure 2:
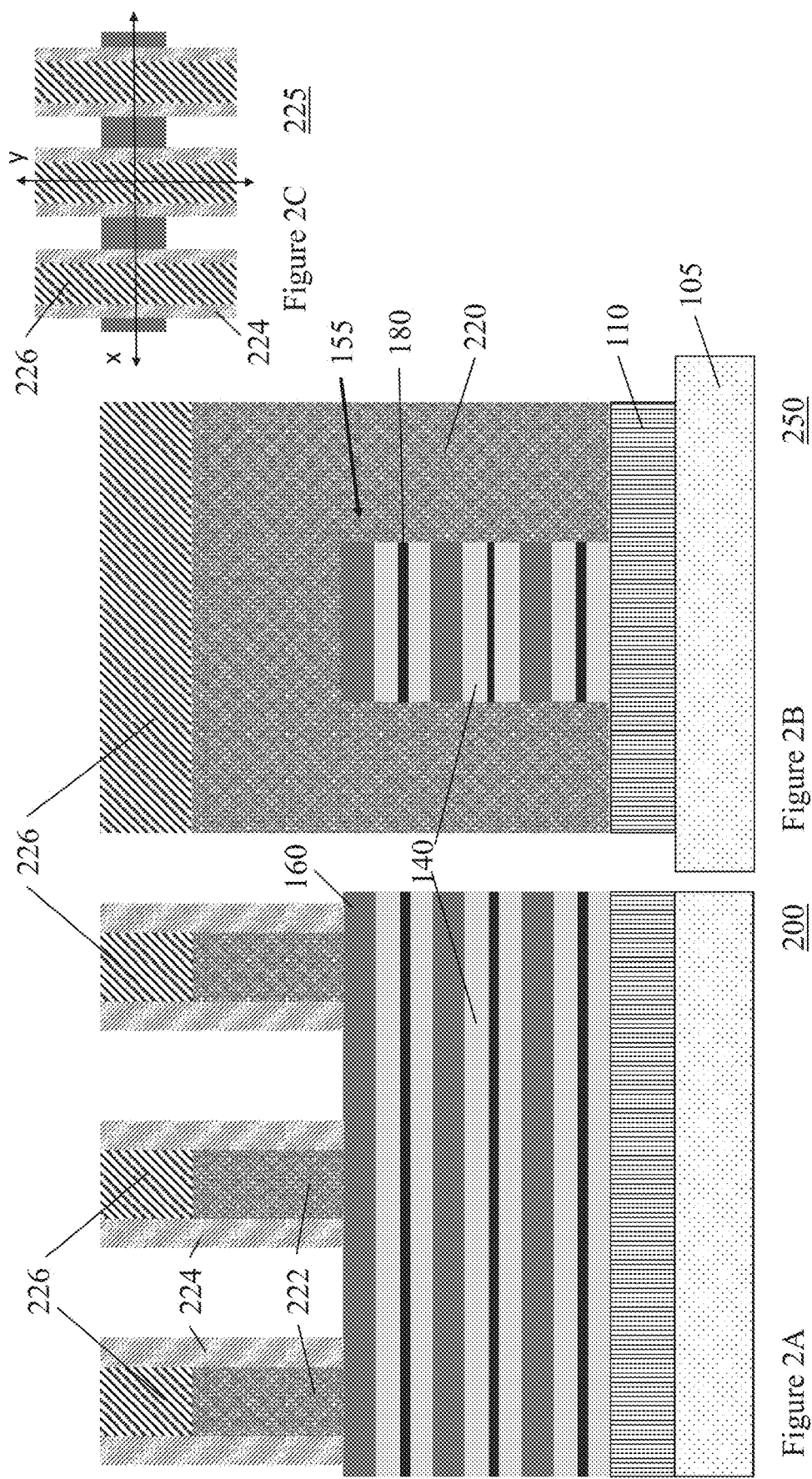
FIG. 2A is a cross section elevation of the nanosheet stack after dummy gate patterning and deposition, hard mask deposition, and spacer formation.
FIG. 2B is a cross section side elevation of the nanosheet stack structure shown in FIG. 2A.
FIG. 2C is a top view of the nanosheet stack in FIG. 2A showing directions with respect to the nanosheet stack structure.

FIG. 2A is a cross section elevation of an interim nanosheet stack structure 200 after dummy gate 222 deposition, hard mask 226 deposition, hard mask/dummy gate patterning, and spacer 224 formation.

The dummy gates 222 are deposited over the nanosheet structure, wrapping around the nanosheet structure as shown in FIG. 2B. The dummy gates 222 are made of a sacrificial gate material including, for example, a thin layer of $SiO_2$ followed by amorphous silicon ($\alpha$-Si) or polycrystalline silicon (polysilicon). The sacrificial material may be deposited by a deposition process, including, but not limited to Atomic Layer Deposition (ALD), Physical Vapor Deposition (PVD), Chemical Vapor Deposition (CVD), Plasma Enhanced Chemical Vapor Deposition (PECVD), or any combination thereof. The sacrificial material forming the dummy gate 222 has a thickness of about 10 nm to about 300 nm, or from about 80 nm to about 150 nm.

The hard mask 226 is deposited on the dummy gate 222 by deposition techniques described above. The hard mask 226 is a protective, dielectric material, including but not limited to: silicon nitride (SiN), siliconborocarbonitride (SiBCN), silicon oxycarbonitride (SiOCN), and silicon oxynitride (SiON). The hard mask 226 thickness is between 20 nm and 100 nm. In some embodiments the hard mask 226 is SiN.

The spacers 224 are formed by a conformal deposition, e.g. ALD, followed by a directional etch back. The spacers 224 are between 4 nm and 15 nm thick and are made from a dielectric material with a low dielectric constant, k. Spacer 224 materials include low k dielectrics like dielectric oxides (e.g. silicon oxide), dielectric nitrides (e.g., SiN, SiBCN), dielectric oxynitrides (e.g., SiOCN, SiCO). The hard mask 226 and the spacers 224 can be made of the same material but don't have to be.

FIG. 2B is a cross-section side elevation 250 of the nanosheet stack structure 200 shown in FIG. 2A. The cross-section 250 is cut by the y-axis shown in FIG. 2C. The cross-section side elevation 250 shows the dummy gate 220 encompassing the entire nanosheet stack fin 155. The hard mask 226 covers the dummy gate 220 in this view as well.

FIG. 2C is a top view 225 of the nanosheet stack in FIG. 2A showing directions with respect to the nanosheet stack structures (200, 250). The top of the hard mask 226 and spacers 224 is shown.

Figure 3:
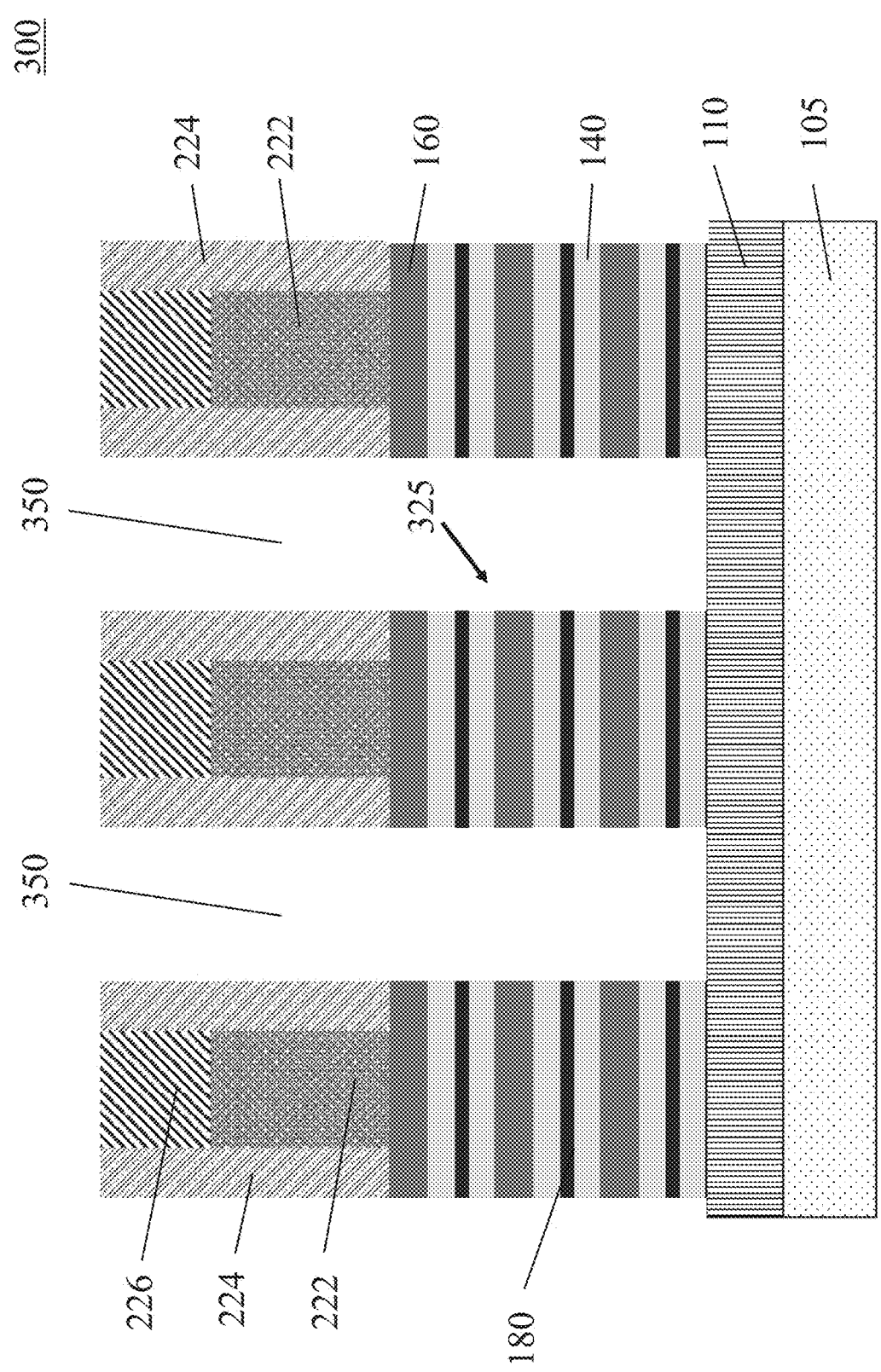
FIG. 3 is a cross section elevation of the nanosheet stack after a recessing step creates nanosheet columns.

FIG. 3 is a cross section elevation of the nanosheet stack 300 after a recessing step. The recessing step is performed by a directional etch with a chemistry that can remove all the material making the nanosheet stack layers (140, 160, 180)

that are unprotected by the hard mask 226 and the spacers 224. The directional etch opens voids 350, creating columns of nanosheets, e.g. 325, from the fin 155 and exposes edges of the nanosheet stack layers (140, 160, 180).

Figure 3A:
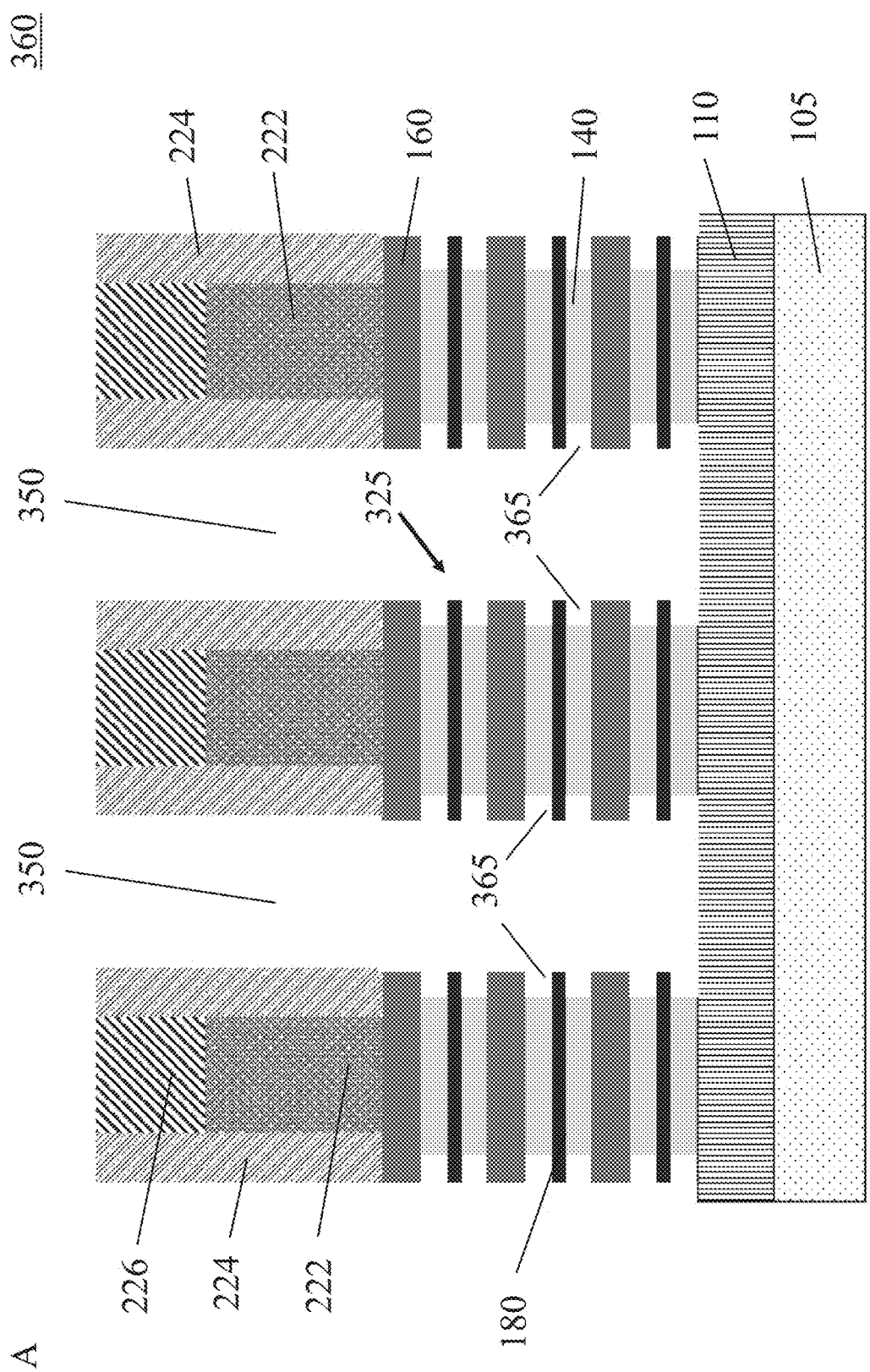
FIG. 3A is a cross section elevation of the nanosheet stack after indentations are made in the edges of the SiGe60 layers by a selective etch step.

FIG. 3A is a cross section elevation of the nanosheet stack 360 after indentations 365 are made in the edges of the SiGe60 layers 140 by a selective etch step.

In some embodiments, indentations are made by selectively removing SiGe60 material from the edges of the SiGe60 layers 140 through either a dry etch, like vapor phased isotropic dry etch, or an isotropic wet etch. Known chemistries etch materials with a high Ge content, e.g. SiGe60, faster than material with a low Ge content, e.g. SiGe20 or Si. By timing the etch correctly, an indentation (typically 365) can be created in each of the exposed edges of the SiGe60 layers 140 without removing the entire SiGe60 layer 140 and without removing any significant amount from the edges of the SiGe20 layers 180 or Si/channel layers 160.

Figure 4:
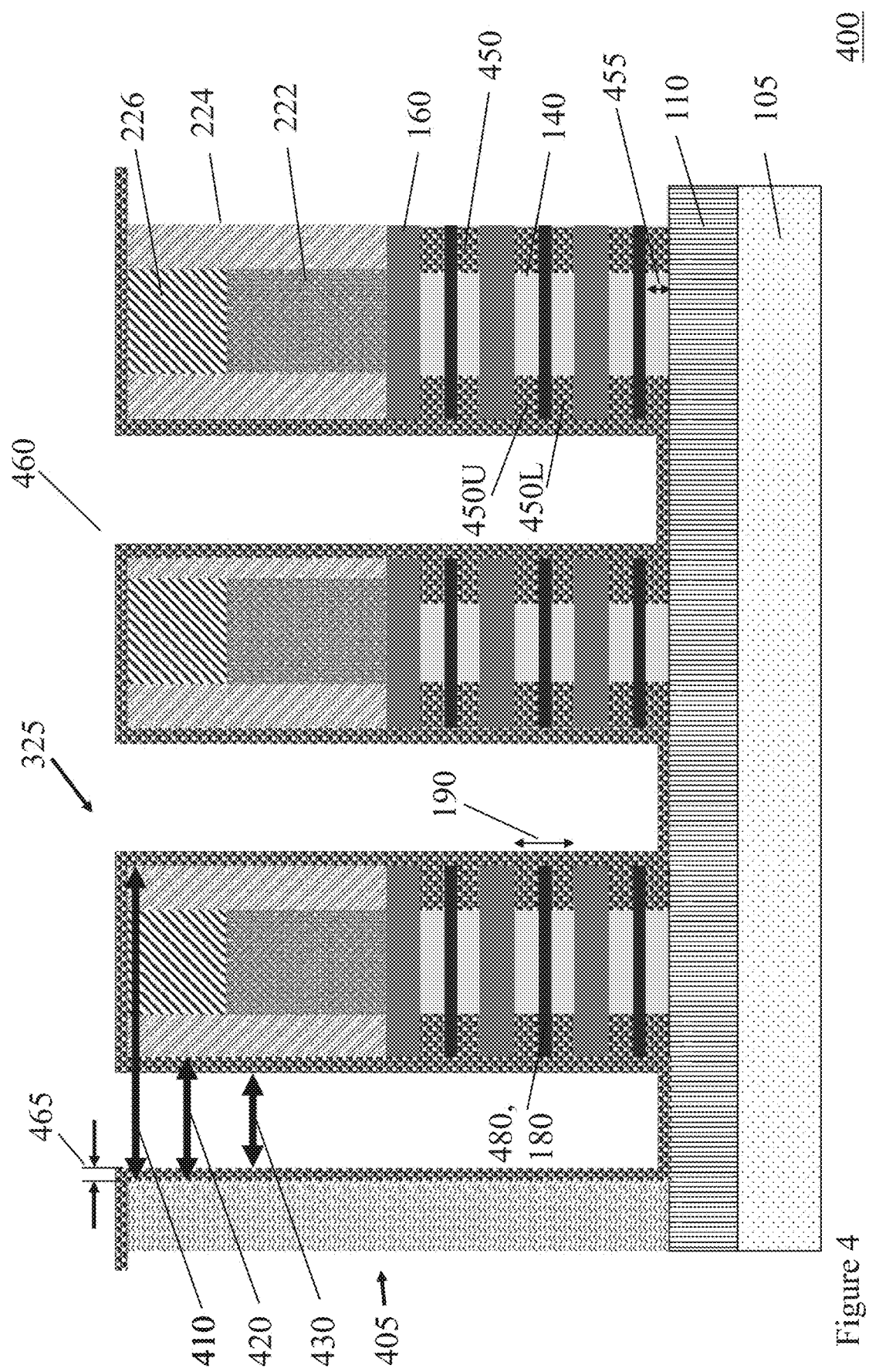
FIG. 4 is a cross section elevation of the nanosheet columns after a conformal deposition fills the indentations.

FIG. 4 is a cross section elevation of the nanosheet stacks/columns 400 after a conformal deposition 460 fills the indentations 365 to form the inner spacer 450.

The indentations 365 are filled by a conformal deposition 460, e.g. ALD, which covers the interior surfaces of the indentations 365 as well as the rest of the structure 400. To fill the entire volume of the indentations 365, the thickness 465 of the deposition 460 needs only to be ½ the thickness 455 of either an upper 450U or lower 450L inner spacer 450.

Once the indentations 365 are full of the dielectric material, an isotropic etching step (see FIG. 4A) can remove the layer 460 from surfaces outside of the indentations without any significant removal of material from the indentations/edges of the SiGe20 layer 180.

As before, upper 450U and lower 450L inner spacer 450 materials include low k dielectrics like dielectric oxides (e.g. silicon oxide), dielectric nitrides (e.g., SiN, SiBCN), dielectric oxynitrides (e.g., SiOCN, SiCO).

Note that the total distance 190 between the Si layers or channel layers 160 is the suspension, Tsus 190, and is equal to the sum of the thickness 455 of the upper inner spacer 450U, lower inner 450L spacer 450, and the thickness 480 of the SiGe20 layer 180 between them. In addition, the larger the thickness 480 of the middle SiGe20 layer 180 between, the smaller the thicknesses of the upper 450U and lower 450L inner spacers 450 are.

FIG. 4 further shows the columns of nanosheet columns 325 as discussed above with an adjacent device 405 shown with no detail. A distance 410 between a common feature on the adjacent device 405, e.g. a gate edge, and the same feature on the adjacent device/column 325 defines the pitch 410 of the device array, or the Contacted Gate Poly-Pitch (CPP) 410.

The distance 420 between the outside surfaces of the adjacent walls of the adjacent devices (405, 325) is the device spacing 420 with the given CPP 410 before there is a conformal deposition 460.

A conformal deposition 460 fills each of the indentations 365 etched out of the edges of the SiGe60 140 layers to form the lower inner spacers 450L, typically 450, and an upper inner spacers, 450U, typically 450. Each of the lower inner spacers 450L will be on a lower side of one of the SiGe20 layers 480 and each of the upper inner spacers 450U will be on an upper side of the corresponding SiGe20 layer 180. Each of the upper and lower inner spacer 450 will have a thickness 455 equal to and determined by the thickness 455 of the respective SiGe60 layer 140.

The distance 430 is the reduced distance between the adjacent device (405, 325) caused by the conformally disposed inner spacer liner 460 that closes the two sides of the device spacing 420. The inner spacer liner 460 has an inner spacer liner thickness 465.

As can be seen, the inner spacer liner 460 thickness 465 should be kept as small as possible in order to reduce the CPP 410.

As the CPP 410 approaches 50 nm or lower, the thickness of the inner spacer liner 460 becomes a greater percentage of the remaining reduction of CPP 410. Accordingly, the conformal deposition used to make the inner spacer 450 limits the CPP 410 of the entire array. Further, in the prior art, the amount of reduction of CPP 410 is about equal to the thickness of the entire inner spacer 850 (below), Tsus 190.

If the inner spacer liner 460 thickness 465 is too thick, e.g. the thickness 465 approaches % the thickness, Tsus 190, or more of the entire inner spacer 850 (below), the entire device spacing distance 420 can be pinched off with the inner spacer liner 460 deposition and the deposited material cannot be removed in later removal steps.

The present invention greatly reduces this constraint because the invention divides the Tsus 190 thickness into three parts or thicknesses: the thickness 455 of the lower inner spacer 450L, the thickness 455 of the upper inner spacer 450U, and the thickness 480 of the middle inner spacer. See description below. Further, both the lower 450L and upper 450U inner spacer are created with the same deposition so the deposition layer 460 and inner spacer liner 460 is reduced approximately by %, assuming the SiGe20 layer 180 thickness 480 is low. The inner spacer liner 460 thickness 465 only needs to be thick enough to enable filling or pinch off of the indentations forming the upper 450U and lower 450L inner spacers 450. Therefore, the inner spacer liner 460 thickness 465 will be about ½ of the either the upper 450U or lower 450L inner spacer 450 thickness 455. Accordingly, the reduction of 420 will be no more than the thickness 455 or less than ½ of the Tsus 190. In other words, the thickness 465 of conformally deposited the dielectric material 460 is less than % the suspension distance.

Figure 4A:
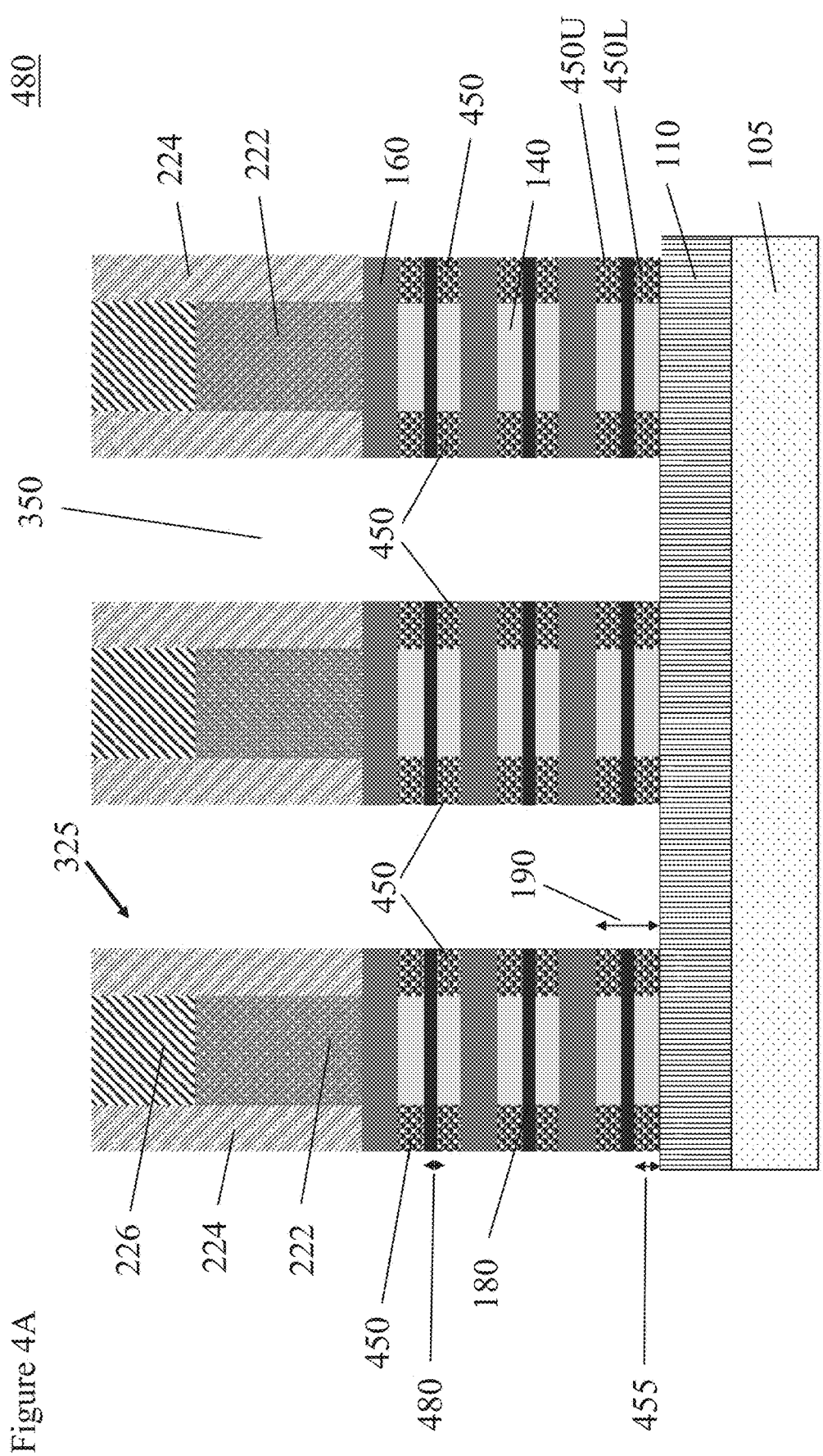
FIG. 4A is a cross section elevation of the nanosheet columns after inner spacer formation and removal of the surface conformal deposition by an etch back.

FIG. 4A is a cross section elevation of the nanosheet columns 325 after inner spacer 450 formation and removal of the surface conformal deposition 460 by an isotropic (multi-directional) etch back step that removes the surface dielectric material but leaves the indentations 365 full. This finishes formation of the upper 450U or lower 450L inner spacers 450.

Figure 5:
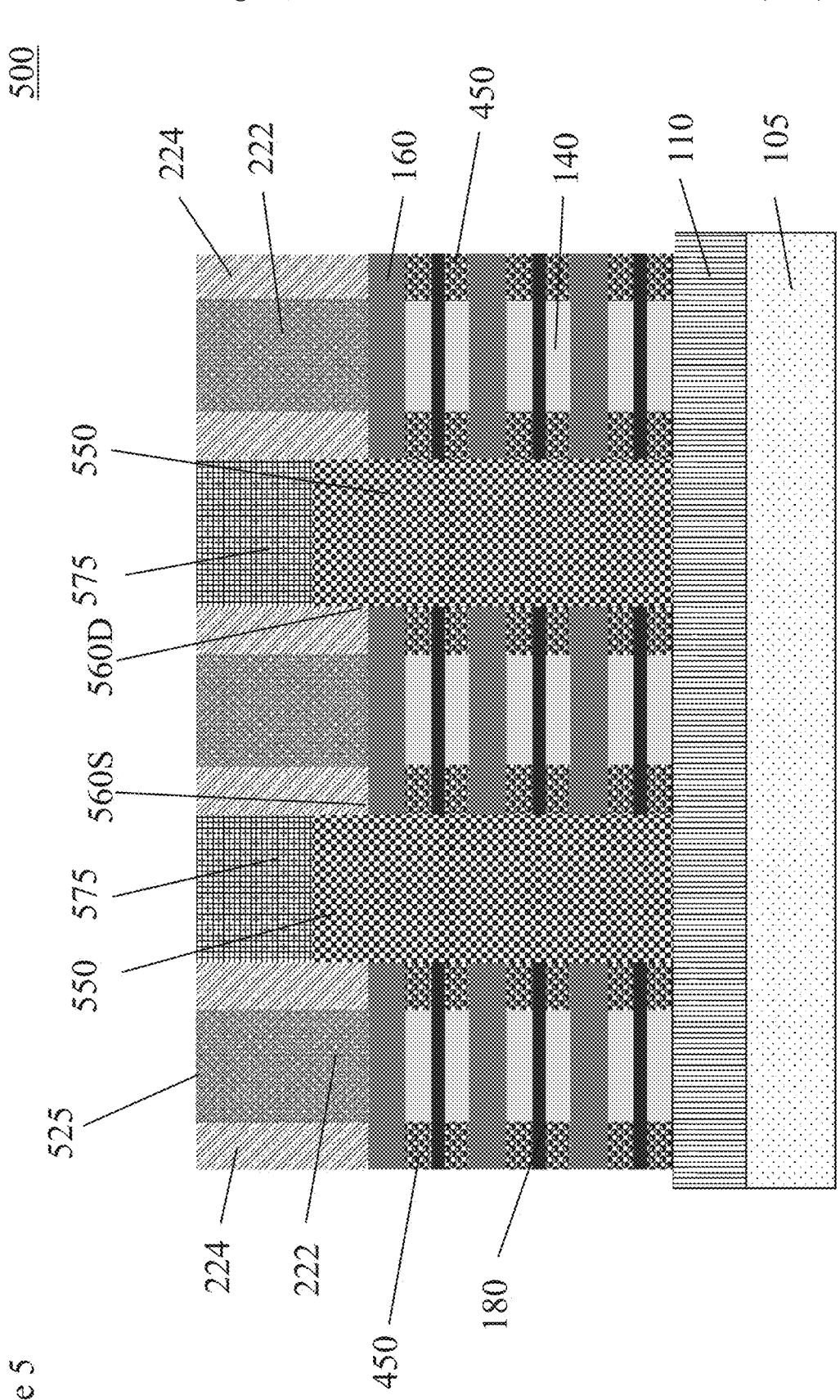
FIG. 5 is a cross section elevation of the nanosheet columns after epitaxial growth of the source and drain (S/D), an interlayer dielectric (ILD) deposition, and a chemical mechanical planarization (CMP).

FIG. 5 is a cross section elevation 500 of the nanosheet columns 325 after epitaxial growth of the source and drain (S/D) 550, an interlayer dielectric (ILD) 575 deposition, and a chemical mechanical planarization (CMP). These steps are performed after the upper 450U and lower 450L inner spacers are formed and the excess spacer material is removed, e.g. by the etch back.

The source/drain (S/D) regions 550 can be epitaxially grown by known techniques. S/D regions 505 can be, e.g., Si:P for an nFET device and SiGe:B for a pFET. It is to be understood that the term "S/D 550 region" as used herein means that a given S/D 550 region can be either a source region or a drain region, depending on the application.

During the epitaxial growth, epitaxial silicon, silicon germanium (SiGe), germanium (Ge), and/or carbon doped silicon (Si:C) silicon can be in-situ doped, meaning dopants are incorporated into the epitaxy layers 550 during the deposition of the respective epitaxial layer 550. Other alternative doping techniques can be used, including but not limited to, for example, ion implantation, gas phase doping, plasma doping, and plasma immersion ion implantation, etc.

More generally, dopants in the epitaxial layer 550 for a p-type dopant (PFET) are selected from a group of boron (B), gallium (Ga), indium (In), and thallium (Tl). In the epitaxial layer 550 for an n-type dopant (NFET), the dopants are selected from a group of phosphorus (P), arsenic (As) and antimony (Sb). Dopants can be at various concentrations. For example, in a non-limiting example, a dopant concentration range may be $1\times10^{18}$ cm$^{-3}$ to $3\times10^{21}$ cm$^{-3}$, or preferably between $2\times10^{20}$ cm$^{-3}$ to $1\times10^{21}$ cm$^{-3}$.

Each of the parallel channels 160 is electrically and physically connected to the source 550 and drain 550. For example, a source side 560S of each parallel channel 160 is connected to the source 550 and a drain side 560D of each parallel channel 160 is connected to the drain 550.

The ILD 575 can be formed from, for example, a low-k dielectric material (e.g. with k<4.0), including but not limited to, silicon oxide, spin-on-glass, a flowable oxide, a high-density plasma oxide, borophosphosilicate glass (BPSG), or any combination thereof. The ILD 575 is deposited by a deposition process, including, but not limited to CVD, PVD, PECVD, ALD, evaporation, chemical solution deposition, or like processes.

The CMP planarizes the surface, removes the hard masks 226, and exposes the dummy gates 525.

Figure 6:
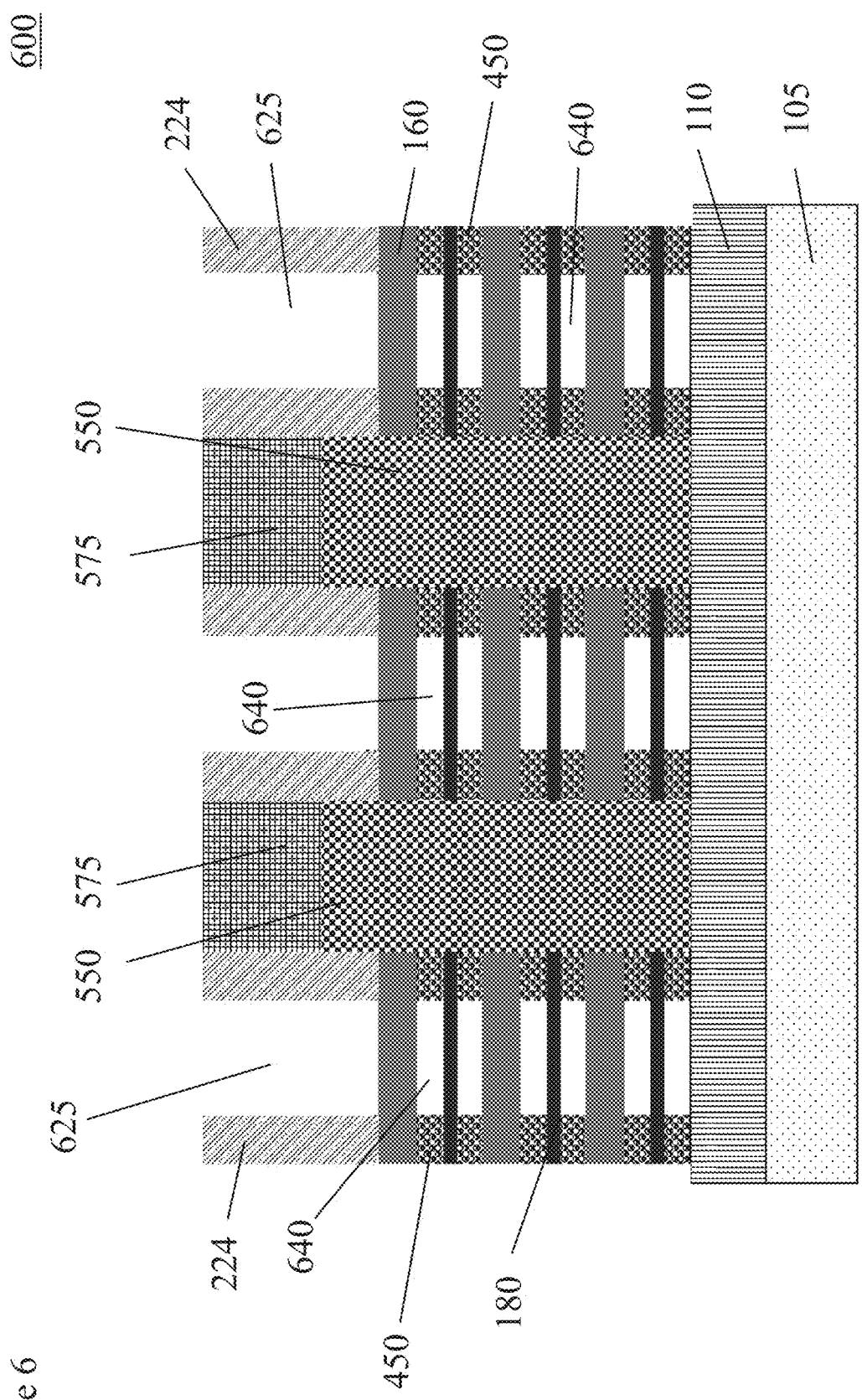
FIG. 6 is a cross section elevation of the nanosheet columns after dummy gate removal and a SiGe60 channel release.

FIG. 6 is a cross section elevation 600 of the nanosheet columns 325 after dummy gate removal and a SiGe60 channel release.

The dummy gate 222 material is selectively removed (pulled) from between the spacers 224 leaving voids 625. A dry etch or exposure to ammonium hydroxide (NH$_4$OH) at higher than room temperature can be used for pulling the sacrificial gate material including, for example, amorphous silicon (α-Si) or polycrystalline silicon (polysilicon). The dummy gate 222 dielectric also can be removed using a solution of hydrofluoric acid (HF) or dry chemical oxide etch. In some embodiments, a liner is disposed between the dummy gate 222 and both the spacers 224 and top surface (163, 160) to separate the dummy gate 222.

The channel release removes the remaining SiGe60 layers to expose the surfaces of the Si/channel layers 160. This leaves gate voids 640 around the Si/channel layers 160. The sacrificial SiGe60 layers can be removed by a suitable dry or wet etching process that etches a high-Ge-content SiGe (e.g. SiGe60) faster than a low-Ge-content SiGe (e.g. SiGe 20) or pure Si.

Figure 7:
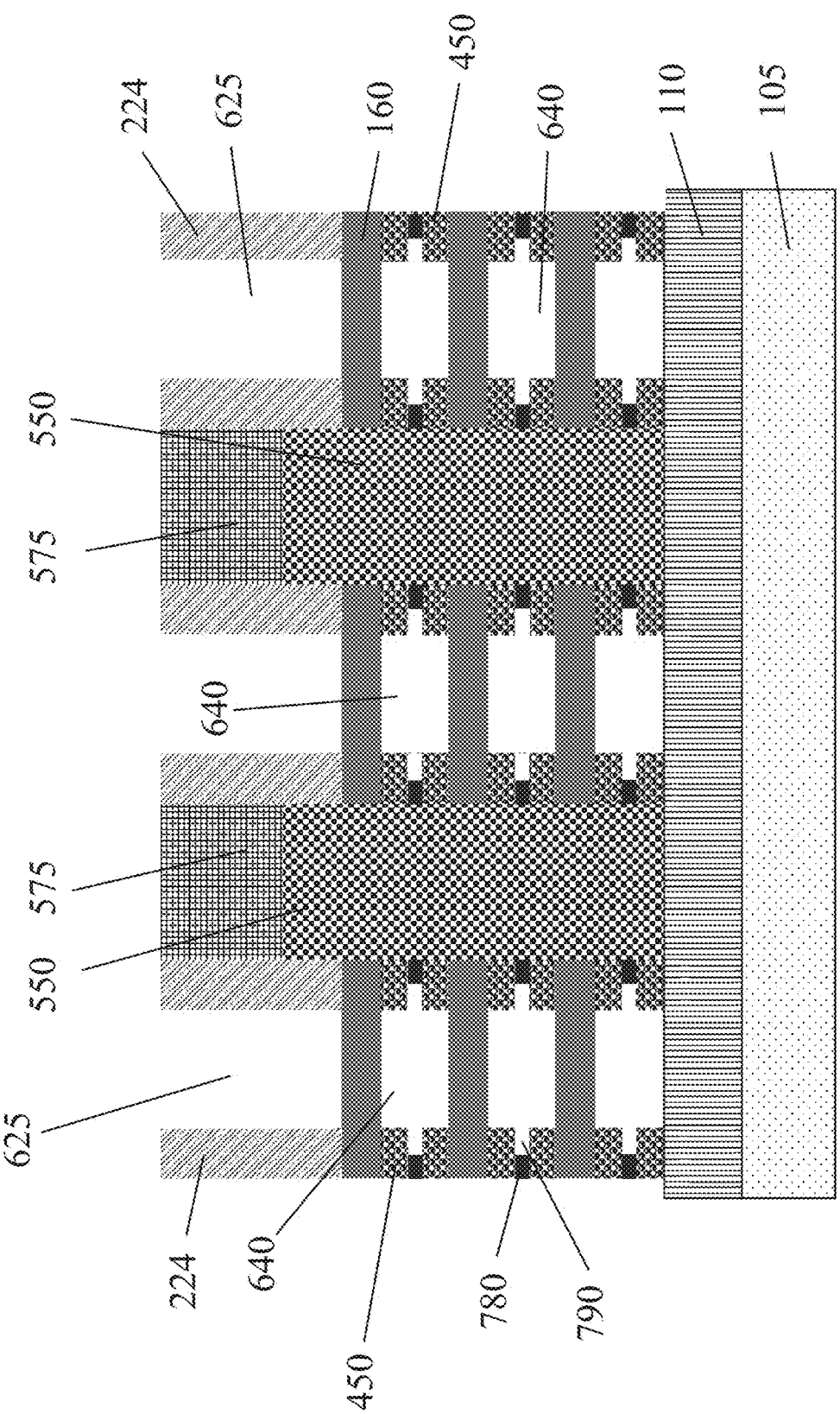
FIG. 7 is a cross section elevation of the nanosheet columns after a selective SiGe20 trimming and indentation.

FIG. 7 is a cross section elevation 700 of the nanosheet columns 325 after a selective SiGe20 trimming and indentation 790.

In this embodiment, the now open surfaces of the SiGe20 layers in the gate voids 640 are exposed to a timed etch with the etchants being either stronger and/or exposed longer than in the step that removed the SiGe60 layers 140. Exposure times and etchants are chosen to not significantly remove the Si layers 160.

As the SiGe20 layer 180 material is removed in the gate voids 640, the etchant removes SiGe20 layer material between the upper 450U and lower 450L inner spacers 450. This removal or trimming of the SiGe20 layer edges causes an indentation 790 between each of the pairs of upper 450U and lower 450L inner spacers 450. The depth of the indentation 790 is between 2 nm and 12 nm.

Figure 8:
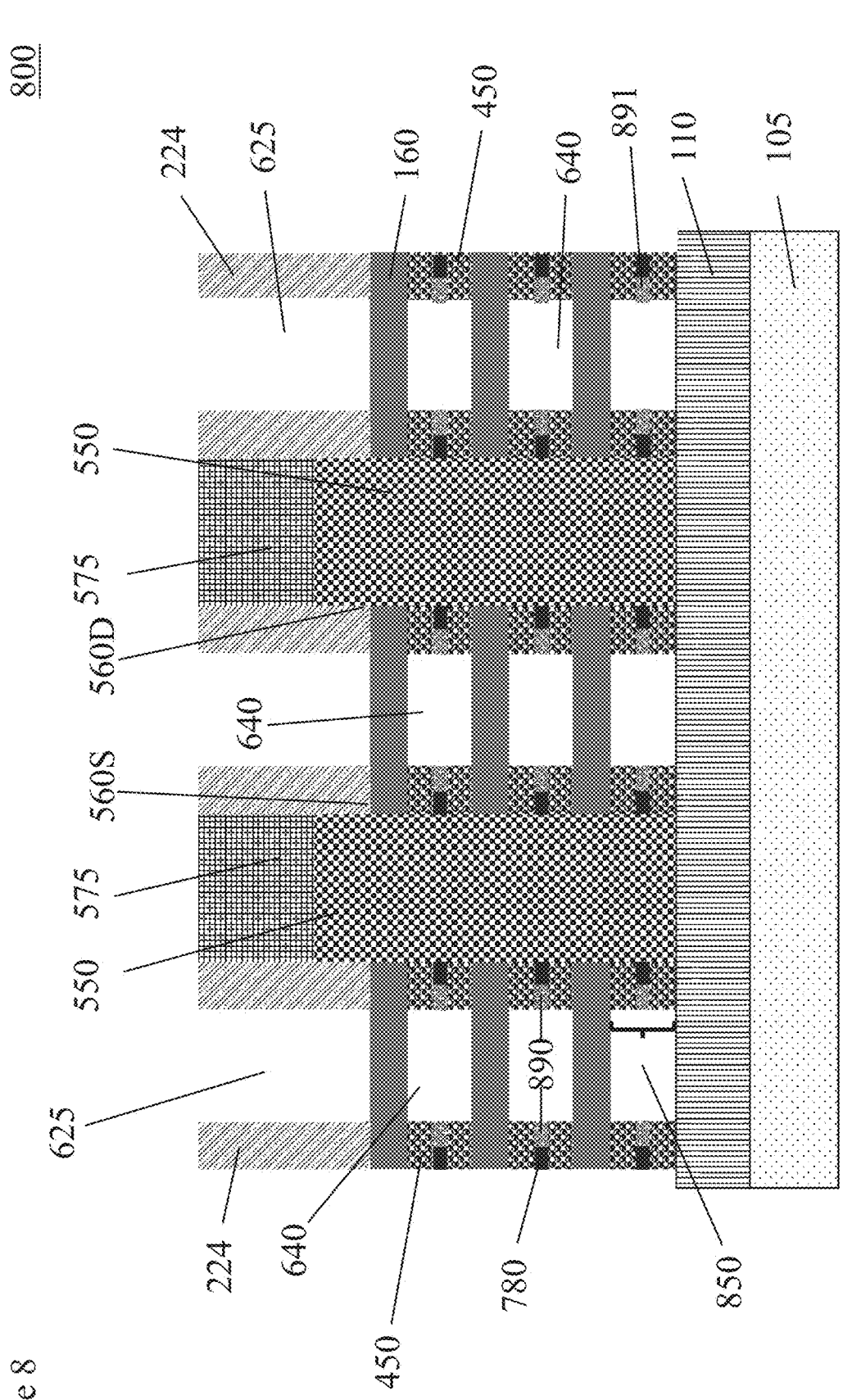
FIG. 8 is a cross section elevation of the nanosheet columns after the formation of a plurality of inner spacers.

FIG. 8 is a cross section elevation 800 of the nanosheet columns 325 after the formation of a plurality of middle inner spacers 890.

After the indentations 790 in the SiGe20 layer edges are etched, a conformally layer of low k dielectric material is disposed with a thickness large enough to fill the indentations 790 in the edges of the SiGe20 layers with the dielectric material. The conformal layer is disposed by standard processes like ALD.

The conformal layer fills the indentation 790 with the low k dielectric material forming a middle inner spacer 890 between each pair of upper 450U and lower 450L inner spacers 450. Since the thickness of the indentation 790 is the same as the thickness of the SiGe20 layer 180, the conformal layer can be very thin. The conformal layer only needs to be ½ the thickness of the indentation 790 to fill the indentation 790. In some embodiments, the conformal layer is between 1 and 5 nm.

The disposed low k dielectrics 891 filling the indentation 790 include but are not limited to dielectric oxides (e.g. silicon oxide, SiO2), dielectric nitrides (e.g., SiN, SiBCN), dielectric oxynitrides (e.g., SiOCN, SiCO). In some embodiments, the middle inner spacer 890 dielectric part 891 is made of SiO2. In some embodiments, the middle inner spacer 890 dielectric part 891 is made of a lower k material than the other inner spacers 450. In some embodiments, all the inner spacers (450U, 450L, and 890) are made of the same material.

There is an isotropic (multi-directional) etch back step that removes the disposed low k dielectric outside of the indentation 790 but does little significant material removal within the indentation 790 because isotropic etch is stopped before starting etching into the material pinched-off inside 790.

In some embodiments, the lower-k material chosen for the upper 450U and lower 450L inner spacers 450 is harder than the lower-k material chosen for the middle inner spacer 890. Accordingly, the etch back step after the middle inner spacer 890 is formed has little affect on the upper 450U and lower 450L inner spacers 450.

The middle inner spacer 890 is made of two parts a middle inner spacer 890 dielectric part 891 and a middle inner spacer 890 semiconductor part 780. The middle inner spacer 890 dielectric part 891 is in contact with the gate stack (below) and the semiconductor part 780 is in contact with either the source or the drain 550.

The middle inner spacer 890 is formed before any gate stack materials are deposited. The middle inner spacer 890 formation completes the formation of the inner spacer 850, pairs of which 850 separate each of the channel layers 160 from one another 160. The channel layer 160 separation, or Tsus, 190 remains tall because the inner spacers 850 can be made a thickness equal to the tall separation 190 without significantly reducing the device spacing 420. The inner spacers 850 separate adjacent parallel channels 160 at both the source side 560S and drain side 560D.

The thickness 190 of the inner spacer 850 remains thick because the thickness 190 is the sum of the thickness of three spacers: the upper 450U inner spacer 450, the middle inner spacer 890, and the lower 450L inner spacer 450. In addition, a single deposition forms the upper 450U and lower 450B inner spacers 450 simultaneously, not requiring a second deposition placing more material between the device spacing 420. The deposition making the middle inner spacer 890 is thin and has little effect on the device spacing 420.

Figure 9:
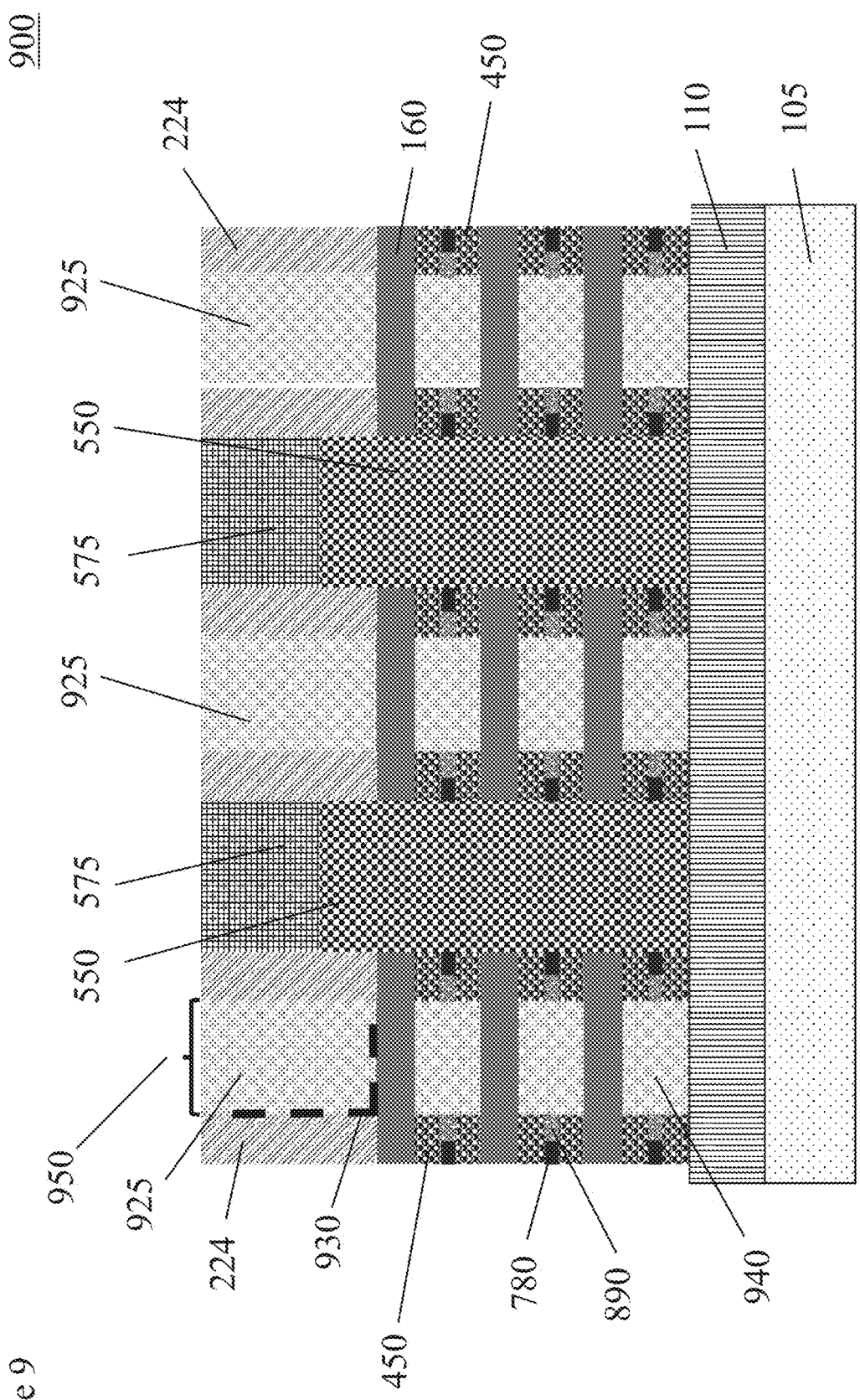
FIG. 9 is a cross section elevation of the nanosheet columns after the formation of a plurality of gate stacks.

FIG. 9 is a cross section elevation of the nanosheet columns 900 after the formation of a plurality of gate stacks (925, 930, and 940, generally 950).

Gate stacks, i.e. high-k metal gates (HKMG) 950, are known. The HKMG 950 include a thin layer of high-k dielectric 930 material covering one or more channel 160 surfaces. The high dielectric material 930 is in contact with a work function metal, WFM, (925, 940) that can be connected to an external contact(s).

FIG. 9 shows only a partial high-k dielectric layer 930 for clarity. The high-k dielectric layer 930 covers all exposed surfaces of the channels 160 and, in some embodiments, surrounds one or more of the channels 160. The high-k dielectric layer 930 covers the spacers (224, 850) as well.

The WFM (925, 940) fills the voids 625 and gate voids 640, surrounding and/or covering the high-k dielectric layer 930. The WFM 925 (filling the void 625 left by the dummy gate pull) can serve as an external electrical contact to the gate stack 950.

Since the tall inner spacer 850 enables a tall suspension 190, the gate voids 640 are large. Larger amounts/volumes of WFM 940 fit within the larger gate voids 640. In addition, a taller suspension, Tsus, 190, e.g. greater than 10 nm, affords a larger selection of WFMs (925, 940) to use.

Gate dielectric material(s) 930 can be a dielectric material having a dielectric constant greater than 3.9, more preferably above 7.0, and still more preferably above 10.0. Non-limiting examples of suitable materials for the gate dielectric material 930 include oxides, nitrides, oxynitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material 930 layer may be formed by suitable deposition processes, for example, CVD, PECVD, ALD, evaporation, PVD, chemical solution deposition, or other like processes. The thickness of the gate dielectric material 930 may vary depending on the deposition process as well as the composition and number of high-k dielectric materials used.

The selection of the WFM (925, 940) depends on the polarity of the Namosheet device. It is appreciated that a pFET uses one type of WFM and an nFET uses another type of WFM. P-type work function materials include compositions such as ruthenium (Ru), palladium (Pd), platinum (Pt), cobalt (Co), nickel (Ni), and conductive metal oxides, or any combination thereof. N-type metal materials include compositions such as hafnium (Hf), zirconium (Zr), titanium (Ti), tantalum (Ta), aluminum (Al), metal carbides (e.g., hafnium carbide (HfC), zirconium carbide (ZrC), titanium carbide (TiC), and aluminum carbide (Al$_4$C$_3$)), aluminides, or any combination thereof.

The WFMs (925, 940) can be deposited by a suitable deposition process, for example, CVD, PECVD, PVD, and thermal or e-beam evaporation.

Figure 10:
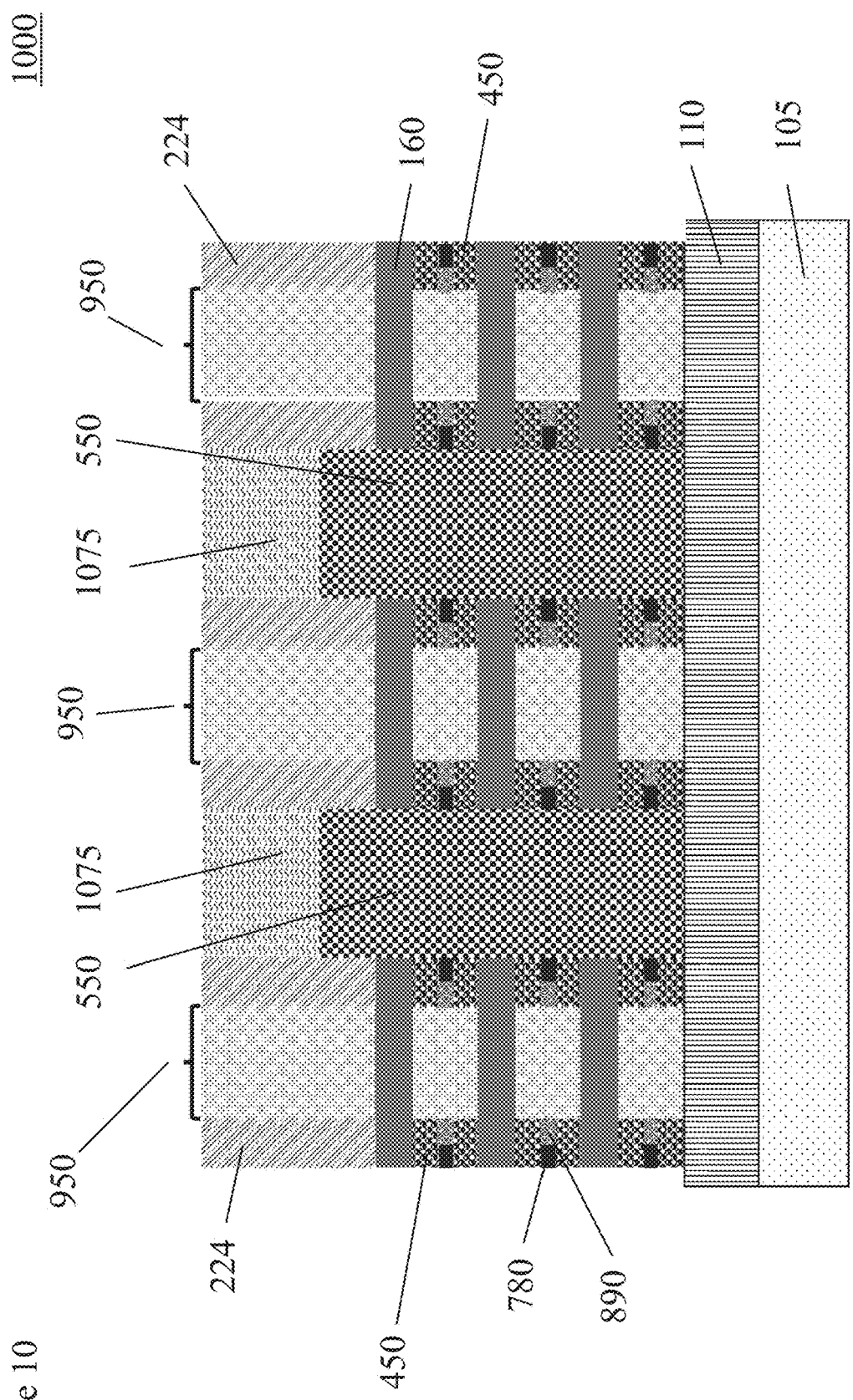
FIG. 10 is a cross section elevation of the nanosheet device after the interlayer dielectric (ILD) is removed and external contacts are deposited for the source and drain (S/D).

FIG. 10 is a cross section elevation of the nanosheet device 1000 after the interlayer dielectric (ILD) 575 is removed and external contacts 1075 are deposited for the source and drain (S/D) 550.

To remove the ILD 575, a patterned resist etch mask is used with an etch process, such as a RIE, until the S/Ds 550 are exposed.

The openings left by the ILD 575 removal are filled with a conductive material 1075 or a combination of conductive materials. The conductive material 1075 may be a conductive metal, for example, aluminum (Al), platinum (Pt), gold (Au), tungsten (W), titanium (Ti), Cobalt (Co) with silicide formed between the metal and epitaxy such as Ni silicide, Ti silicide or NiPt silicide. or any combination thereof.

The conductive material 1075 may be deposited by a suitable deposition process, for example, CVD, PECVD, PVD, plating, thermal or e-beam evaporation, or sputtering.

The metallic contacts 1075 to S/D regions and the gate contacts (925 or to 925) can be wired into useful logic circuits, e.g. CMOS circuits, using known metallization workflows.

Figure 11:
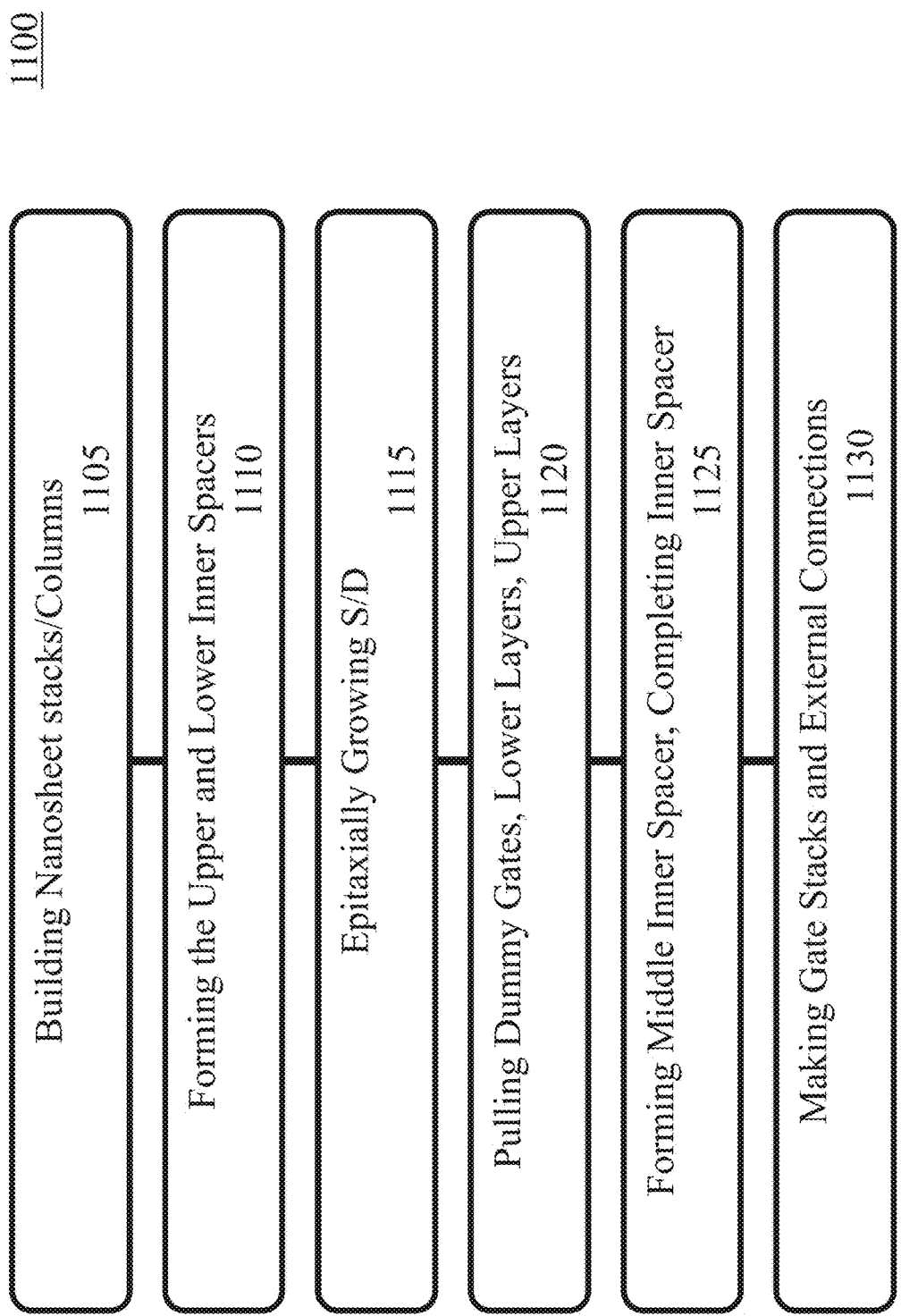
FIG. 11 is a flow chart showing a process for making a nanosheet device with tall suspension and a tight contacted gate poly-pitch.

FIG. 11 is a flow chart showing a process 1100 for making a nanosheet device with tall suspension (190, 850) and with a tight contacted gate poly-pitch 410.

The process begins with step 1105, building one or more nanosheet columns 325 by recessing a nanosheet stack 100 on a substrate 105 and insulating layer 110 by using dummy gates 222, spacers 224, and hard masks 226 as described in the description of FIGS. 1A, 1B, 2A, 2B, and 3, above. The nanosheet columns 325 have repeating patterns of layers. Each pattern has the following sequence of layers from lowest to highest: a lower layer sacrificial material 140; a middle layer sacrificial material 180; an upper layer sacrificial material 140, that is the same as the lower layer sacrificial material; and a channel layer 160, as described above.

In step 1110, an upper inner spacer layer 450U and a lower inner spacer layer 450L are formed by filling indented edges in the lower layer 140 and upper layer 140, respectively, with dielectric material 450.

In step 1115, the S/D 550 regions are epitaxially grown. The upper inner spacer layer 450U and a lower inner spacer layer 450L are formed before the S/D regions 550 are grown.

In step 1120, the dummy gates 222, lower layers 140L, and upper layers 140U are pulled leaving gate voids 640 and voids 625.

In step 1125, the middle layer material 180 is etched to form indentations 790 in the middle layer material 180 edges. The indentations 790 are filled with low-k dielectric forming the middle inner spacer 890 along with the remaining semiconductor material part 780.

The inner spacer 850 is now formed and made of three spacers: the upper 450U inner spacer 450, the middle inner spacer 890, and the lower 450L inner spacer 450.

In step 1130, after the entire inner spacer 850 is formed (including the middle inner spacer 890), the gate stacks 950 and external connections (925, 1075) are made.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A nanosheet FET comprising:
    a substrate;
    a source disposed on the substrate;
    a drain disposed on the substrate;
    a plurality of parallel channels electrically physically connected between the source and the drain, each of the parallel channels having a source side connected to the source and a drain side connecting the drain, each of the channels each being separated from one or more adjacent channels by a suspension distance;
    a plurality of inner spacers, each inner spacer having an inner spacer thickness equal to the suspension distance, and each of the inner spacers separating one of the source sides or one of the drain sides of two adjacent parallel channels, the inner spacers comprising three parts:
        a lower inner spacer;
        a middle inner spacer, the middle inner spacer having two parts, a middle inner spacer dielectric part and a middle inner spacer semiconductor part; and
        an upper inner spacer; and
    a gate stack surrounding one or more of the parallel channels.

2. A nanosheet FET, as in claim 1, where the inner spacer thickness and separation distance are both less than 50 nanometers (nm).

3. A nanosheet FET, as in claim 1, where the middle inner spacer dielectric part is in contact with the gate stack and the semiconductor part is in contact with either the source or the drain.

4. A nanosheet FET, as in claim 1, where there is an insulator disposed on the substrate.

5. A nanosheet FET, as in claim 1, where the lower inner spacer has a lower inner spacer thickness between 3 nm and 10 nm and the upper inner spacer has an upper inner spacer thickness between 3 nm and 10 nm.

6. A nanosheet FET, as in claim 1, where the middle inner spacer has a middle inner spacer thickness between 3 and 10 nm.

7. A nanosheet FET, as in claim 1, where the middle inner spacer dielectric part of the middle inner spacer, the lower inner spacer, and the upper inner spacer are made of one or more of the following materials: dielectric oxides, silicon oxide, dielectric nitrides, SiN SiBCN), dielectric oxynitrides, SiOCN, and SiCO.

8. A nanosheet FET, as in claim 1, where the lower inner spacer, the middle inner spacer dielectric part of the middle inner spacer, and the upper inner spacer are made of the same material.

9. A nanosheet FET, as in claim 1, where the lower inner spacer and upper inner spacer are made of a same material and the middle inner spacer dielectric part of the middle inner spacer is a different material.

10. A nanosheet FET, as in claim 1, where the dielectric part of the middle inner spacer dielectric part is made of a lower-k material than material making the lower inner spacer and the upper inner spacer.

11. An array of nanosheet FETs comprising:
    a substrate;
    an insulating layer disposed on the substrate;
    a first nanosheet FET, comprising:
        a first source disposed on the insulating layer;
        a first drain disposed on the insulting layer;
        a plurality of first parallel channels electrically physically connected between the first source and the first drain, each of the first parallel channels having a first source side connected to the first source and a first drain side connecting the first drain, each of the first parallel channels each being separated from one or more first adjacent channels by a suspension distance;
        a plurality of first inner spacers, each first inner spacer having aft first inner spacer thickness equal to the suspension distance, and each of the first inner spacers separating one of the first source sides or one of the first drain sides of two of the first adjacent channels, the first inner spacers comprising three parts:
            a first lower inner spacer;
            a first middle inner spacer, the first middle inner spacer having two parts, a first middle inner spacer dielectric part and a first middle inner spacer semiconductor part; and
            a first upper inner spacer; and
        a first gate stack surrounding one or more of the first parallel channels;
    one or more second nanosheet FETs, comprising:
        a second source disposed on the insulating layer;
        a second drain disposed on the insulting layer;
        a plurality of second parallel channels electrically physically connected between the second source and the second drain, each of the second parallel channels having a second source side connected to the second source and a second drain side connecting the second drain, each of the second parallel channels each being separated from one or more second adjacent channels by a suspension distance;
        a plurality of second inner spacers, each second inner spacer having a second inner spacer thickness equal to the suspension distance, and each of the second inner spacers separating one of the second source sides or one of the second drain sides of two of the second adjacent channels, the second inner spacers comprising three parts:
            a second lower inner spacer;
            a second middle inner spacer, the second middle inner spacer having two parts, a second middle inner spacer dielectric part and a second middle inner spacer semiconductor part; and
            a second upper inner spacer; and
        a second gate stack surrounding one or more of the second parallel channels;
    a CPP distance determining a pitch of the first nanosheet FET and one or more of the second nanosheet FETs; and
    a device spacing between the first nanosheet FET and one or more of the second nanosheet FETs,
    where the device spacing is less than % of the suspension distance.

12. An array, as in claim 11, where the suspension distance is between 10 and 30 nanometers (nm).

13. A method of making a nanosheet FETs comprising:
    building a nanosheet stack on an insulating layer, the nanosheet stack having a plurality of the following sequence of layers: a lower layer sacrificial material, a middle layer sacrificial material, an upper layer sacrificial material that is the same as the lower layer sacrificial material, and a channel layer;

recessing the nanosheet stack to create a plurality of nanosheet columns;

forming a lower inner spacer at one or more edges of the lower layer sacrificial material;

forming an upper inner spacer at one or more edges of the upper layer sacrificial material;

forming a middle inner spacer at one or more edges of the middle layer sacrificial material, wherein the lower inner spacer, middle inner spacer, upper inner spacer are layered together to form an inner spacer that separates two or more pairs of adjacent and parallel channel layers with a suspension distance between 10 and 30 nm and wherein the middle inner spacer is formed having two parts, a middle inner spacer dielectric part and a middle inner spacer semiconductor part.

14. A method, as in claim 13, further comprising the step of:

growing a source and a drain after the upper inner spacer and lower inner spacer are formed.

15. A method, as in claim 14, further comprising the step of:

after growing the source and the drain, pulling material including the lower layer sacrificial material and the upper layer sacrificial material to expose the channel layers.

16. A method, as in claim 15, further where the middle inner spacer is formed by partially removing the middle layer sacrificial material and filling an indentation with a dielectric material after the channel layers are exposed but before a gate stack is formed.

17. A method, as in claim 13, where the lower layer sacrificial material and the upper layer sacrificial material is SiGe60.

18. A method, as in claim 13, where the middle layer sacrificial material is SiGe20.

19. A method, as in claim 13 where the lower inner spacer and the upper inner spacer are formed by depositing a dielectric material in an indentation in one of the edges of the lower layer sacrificial material and the upper layer sacrificial material, respectively, and by conformally depositing the dielectric material with a conformal layer thickness less than % the suspension distance.

20. A nanosheet FET comprising:

a substrate;

a source disposed on the substrate;

a drain disposed on the substrate;

a plurality of parallel channels electrically physically connected between the source and the drain, each of the parallel channels having a source side connected to the source and a drain side connecting the drain, each of the channels each being separated from one or more adjacent channels by a suspension distance;

a plurality of inner spacers, each inner spacer having an inner spacer thickness equal to the suspension distance, and each of the inner spacers separating one of the source sides or one of the drain sides of two adjacent parallel channels, the inner spacers comprising three parts:

a lower inner spacer;

a middle inner spacer; and an upper inner spacer, the lower inner spacer, the middle inner spacer, and the upper inner spacer each having a conformal thickness; and a gate stack surrounding one or more of the parallel channels.

* * * * *